(12) United States Patent
Lee et al.

(10) Patent No.: US 12,507,547 B2
(45) Date of Patent: Dec. 23, 2025

(54) DISPLAY DEVICE AND MANUFACTURING METHOD THEREOF

(71) Applicant: Samsung Display Co., LTD., Yongin-si (KR)

(72) Inventors: Se Ho Lee, Cheonan-si (KR); Jang Kyu Kim, Yongin-si (KR); Tae Hyung Kim, Seoul (KR); Yong Dae Lee, Seongnam-si (KR); Ho-Jun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 633 days.

(21) Appl. No.: 17/886,349

(22) Filed: Aug. 11, 2022

(65) Prior Publication Data

US 2023/0127195 A1    Apr. 27, 2023

(30) Foreign Application Priority Data

Oct. 22, 2021    (KR) .................. 10-2021-0141673

(51) Int. Cl.
*H10K 59/131* (2023.01)
*H10K 50/824* (2023.01)
*H10K 71/00* (2023.01)
*H10K 59/12* (2023.01)

(52) U.S. Cl.
CPC ......... *H10K 59/131* (2023.02); *H10K 50/824* (2023.02); *H10K 71/00* (2023.02); *H10K 59/1201* (2023.02)

(58) Field of Classification Search
CPC ..... H10K 59/131; H10K 50/824; H10K 71/00
See application file for complete search history.

(56) References Cited

U.S. PATENT DOCUMENTS

| | | | |
|---|---|---|---|
| 9,362,345 B2 | 6/2016 | Jeong et al. | |
| 9,450,039 B2 | 9/2016 | Jeong et al. | |
| 9,570,525 B2 | 2/2017 | Jeong et al. | |
| 9,780,158 B2 | 10/2017 | Lee et al. | |
| 10,147,769 B2* | 12/2018 | Lee | H10K 59/1315 |
| 10,916,723 B2* | 2/2021 | Lee | H10K 71/162 |

(Continued)

FOREIGN PATENT DOCUMENTS

| | | |
|---|---|---|
| EP | 3 333 924 A1 | 6/2018 |
| KR | 10-2016-0023745 A | 3/2016 |

(Continued)

*Primary Examiner* — Abdulmajeed Aziz
*Assistant Examiner* — Steven Y Horikoshi
(74) *Attorney, Agent, or Firm* — Womble Bond Dickinson (US) LLP

(57) ABSTRACT

A display device according to some embodiments includes: a substrate; a plurality of common voltage lines positioned on the substrate; a plurality of connection electrodes positioned on a plurality of common voltage lines; an emission layer positioned on the connection electrode; and a common electrode positioned on the emission layer, wherein the emission layer has a plurality of first openings positioned on at least a portion of a plurality of connection electrodes, the common electrode is electrically connected to the connection electrode through a plurality of first openings, and a pitch of a first direction of a plurality of first openings has a range of about 0.1 mm to about 2.5 mm.

20 Claims, 22 Drawing Sheets

(56) References Cited

U.S. PATENT DOCUMENTS

| | | | | |
|---|---|---|---|---|
| 2014/0239262 | A1* | 8/2014 | Kim | H10K 59/123 |
| | | | | 257/40 |
| 2014/0374732 | A1* | 12/2014 | Jeong | H10K 59/1213 |
| | | | | 438/34 |
| 2017/0125506 | A1 | 5/2017 | Kim | |
| 2018/0158878 | A1 | 6/2018 | Lee et al. | |
| 2019/0081111 | A1 | 3/2019 | Lee et al. | |
| 2019/0181345 | A1* | 6/2019 | Hwang | H10K 50/11 |
| 2020/0279900 | A1 | 9/2020 | Park et al. | |
| 2021/0134902 | A1 | 5/2021 | Lee et al. | |
| 2022/0254845 | A1* | 8/2022 | Wei | H10K 50/824 |

FOREIGN PATENT DOCUMENTS

| | | |
|---|---|---|
| KR | 10-2018-0009441 A | 1/2018 |
| KR | 10-2020-0125897 A | 11/2020 |
| KR | 10-2021-0053395 A | 5/2021 |
| WO | WO 2017/074103 A1 | 5/2017 |

* cited by examiner

Related Art

Related Art

Related Art

FIG. 19

| pixel interval of opening | pitch of opening | visibility |
|---|---|---|
| 3×3 | 1.116um | Mura × |
| 6×6 | 2.232um | Mura × |
| 18×18 | 6.696um | Mura ○ |
| 24×24 | 8.928um | Mura ○ |

FIG. 20

| panel diagonal size | 34" | 31.5" | 65" | 55" |
|---|---|---|---|---|
| pixel interval of opening | 5×5 | 6×6 | 3×3 | 3×3 |
| pitch of opening (mm) | 1.157 | 1.088 | 1.116 | 0.945 |

DISPLAY DEVICE AND MANUFACTURING METHOD THEREOF

CROSS-REFERENCE TO RELATED APPLICATION

This application claims priority to, and the benefit of, Korean Patent Application No. 10-2021-0141673 filed in the Korean Intellectual Property Office on Oct. 22, 2021, the entire contents of which are incorporated herein by reference.

BACKGROUND

1. Field

The present disclosure relates to a display device, and to a manufacturing method thereof.

2. Description of the Related Art

A display device includes a display area including a plurality of pixels. Each pixel includes a pixel electrode to which a data signal is applied, a plurality of transistors and at least one capacitor for transmitting a data signal to the pixel electrode, and a common electrode facing the pixel electrode. At least one layer may be positioned between the pixel electrode and the common electrode.

The common electrode may be formed as one electrode over a plurality of pixels to transmit a constant voltage.

The above information disclosed in this Background section is only for enhancement of understanding of the background of the present disclosure, and therefore it may contain information that does not form the prior art that is already known in this country to a person of ordinary skill in the art.

SUMMARY

The common electrode formed over a plurality of pixels may be electrically connected to an underlying connection electrode through an opening formed in a layer positioned thereunder.

Embodiments of the present disclosure may reduce contamination due to particles generated when forming the opening where the common electrode is connected to the underlying connection electrode to shorten a manufacturing process time, and may improve uniformity of luminance of the display area to such an extent that a mura is either less visible or not visible.

A display device according to some embodiments includes a substrate common voltage lines on the substrate, connection electrodes on common voltage lines, an emission layer on the connection electrode, and defining first openings on at least a portion of the connection electrode, a pitch of a first direction of the first openings having a range of about 0.1 mm to about 2.5 mm, and a common electrode on the emission layer, and electrically connected to the connection electrode through first openings.

The display device may further include pixels, the pixels including sub-pixels corresponding to different colors and including a transistor and a light emitting diode (LED), the light emitting diode (LED) including a pixel electrode, the emission layer, and the common electrode.

The pitch of the first openings in the first direction may be greater than a pitch of the pixels in the first direction.

The pitch of the first openings in the first direction may be greater than a pitch of the common voltage lines in the first direction.

The pitch of the first openings in the first direction may be greater than a pitch of the connection electrodes in the first direction.

The connection electrodes may be at a same conductive layer as, and may include a same material as, the pixel electrode.

The display device may further include an insulating layer between the pixel electrode and the emission layer, and defining a second opening overlapping one of the first openings.

The one of the first openings may be within an edge of the second opening in a plan view.

An edge of the one of the first openings and an edge of the second opening may be aligned with each other.

A pitch of the first openings in a second direction, which is substantially perpendicular to the first direction, may have a range of about 0.1 mm to about 2.5 mm.

A display device according to some embodiments includes a substrate common voltage lines on the substrate, connection electrodes on common voltage lines, an emission layer on the connection electrodes, defining first openings on at least a portion of connection electrodes, and having an opening formation region defining the first openings and an opening non-formation region not including the first openings, the opening formation region and the opening non-formation region being alternately arranged in a first direction, and a common electrode on the emission layer, and electrically connected to the connection electrodes through the first openings.

The first openings may be arranged in the opening formation region with a constant pitch in a first direction, the pitch being in a range of about 0.1 mm to about 2.5 mm.

A width of the opening non-formation region between the opening formation region and an adjacent opening formation region in the first direction may be greater than a pitch of the first openings, and equal to or less than a value equal to twice the pitch of the first openings added to a width of the opening formation region in the first direction.

A width of the opening formation region in the first direction may be equal to a width of the opening formation region in a second direction that is substantially perpendicular to the first direction.

The width of the opening non-formation region in the first direction may be equal to a width of the opening non-formation region in a second direction that is substantially perpendicular to the first direction.

The display device may further include pixels, the pixels including sub-pixels corresponding to different colors, the sub-pixels including a transistor and a light emitting diode (LED), the light emitting diode (LED) including a pixel electrode, the emission layer, and the common electrode.

The pitch of the first openings in the first direction may be greater than a pitch of the pixels in the first direction.

A pitch of openings in the opening formation region in a second direction that is substantially perpendicular to the first direction may have a range from about 0.1 mm to about 2.5 mm.

A manufacturing method of a display device according to some embodiments includes forming common voltage lines on a substrate, forming connection electrodes on the common voltage lines, stacking and patterning an insulating layer on the connection electrodes to form first openings having a pitch in a first direction in a range of about 0.1 mm to about 2.5 mm, stacking an emission layer on the insulating layer, forming second openings corresponding to the first openings by removing a portion of the emission layer by a laser drilling process, and forming a common electrode on the emission layer, and electrically connected to the connection electrodes through the second openings.

The emission layer may have an opening formation region defining the first openings, and an opening non-formation region not including the first openings, wherein the opening formation region and the opening non-formation region are alternately arranged in the first direction.

According to embodiments, while improving the uniformity of the luminance of the display area to a degree that mura is not recognized, the manufacturing process time may be shortened by reducing contamination by particles that occurs during the formation of the opening where the common electrode is connected to the underlying connection electrode.

BRIEF DESCRIPTION OF THE DRAWINGS

FIG. 19 is a table showing a common voltage drop and a visibility result of several display devices according to some embodiments and a comparative example.

FIG. 20 is a table showing an example of a pitch of an opening in which mura is not recognized in several display devices according to some embodiments.

DETAILED DESCRIPTION

Figure 1:
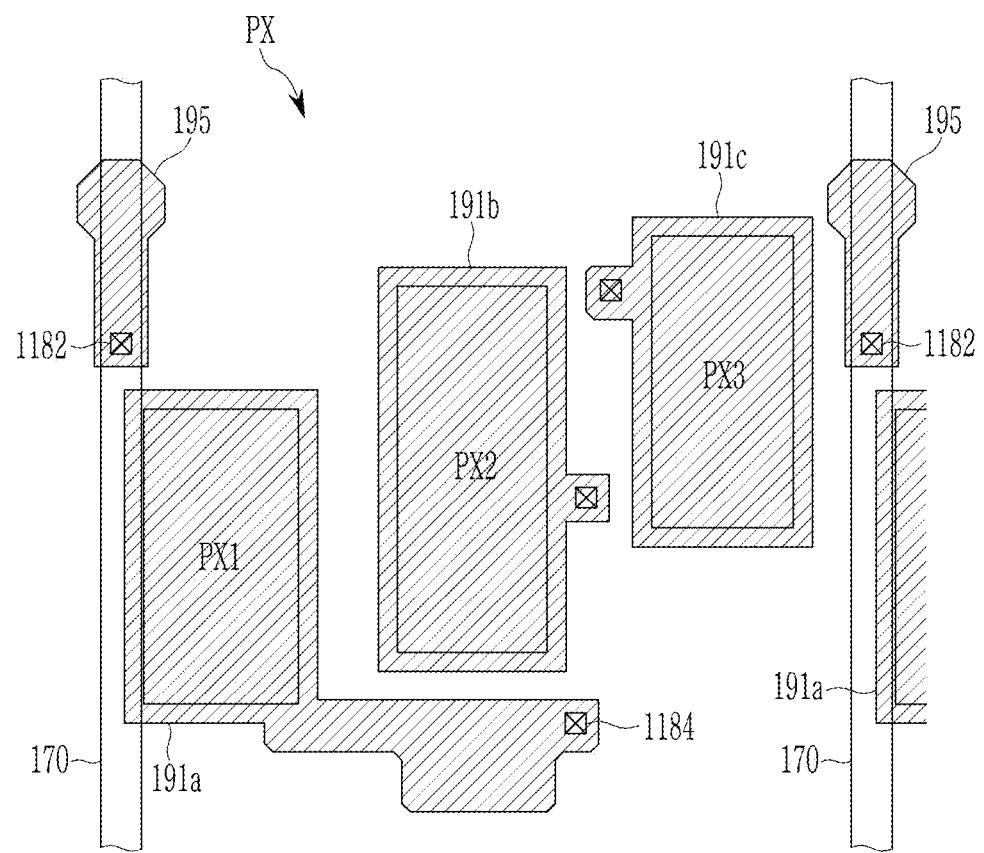
FIG. 1 is a top plan view for one electrode layer and a common voltage line, which are positioned in one pixel of a display area of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112 (a) and 35 U.S.C. § 132 (a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, a structure of a display device according to some embodiments is described with reference to FIG. 1 to FIG. 5.

Figure 2:
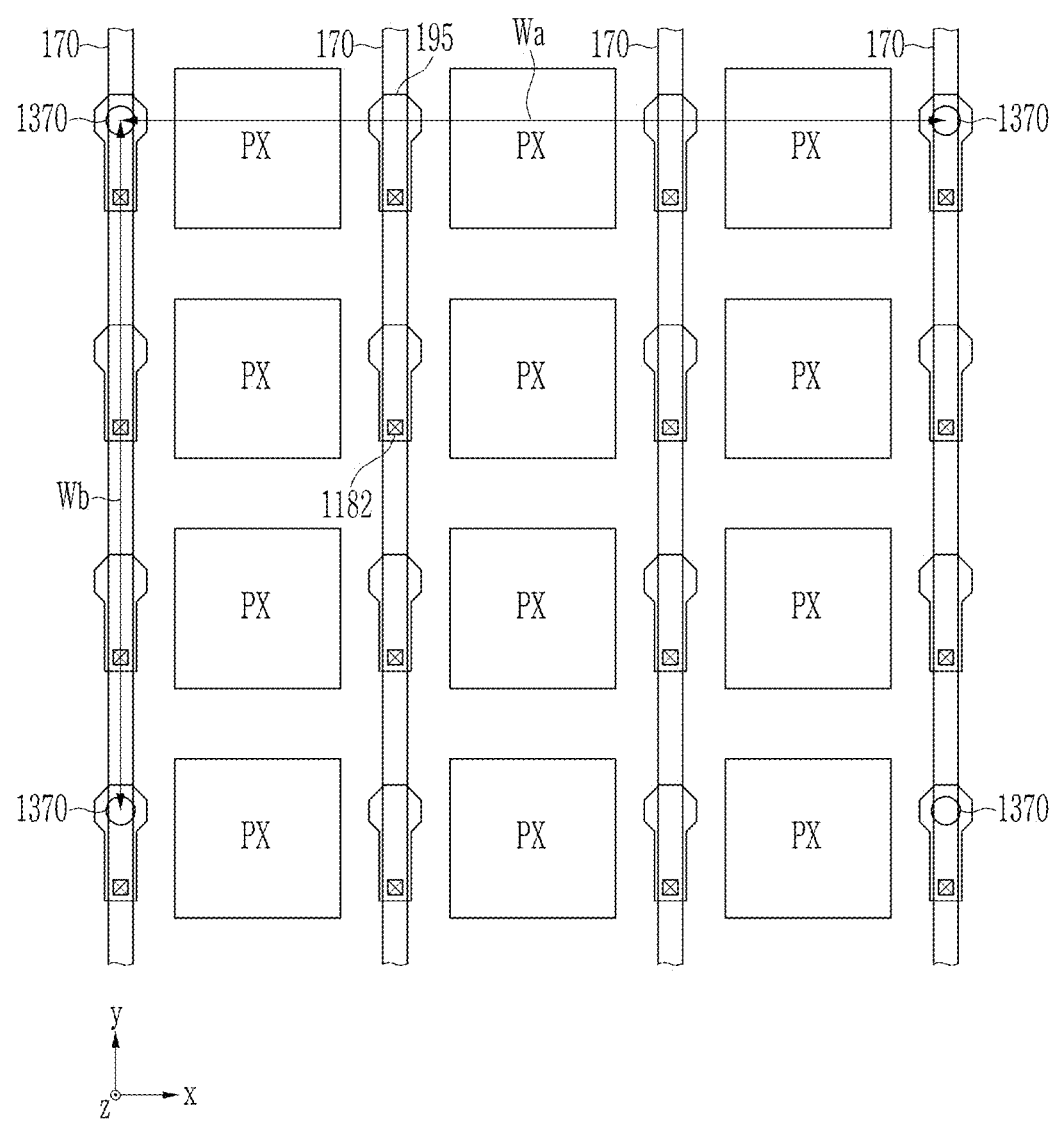
FIG. 2 is a top plan view of a plurality of pixels and a plurality of connection electrodes of a display area of a display device according to some embodiments.

FIG. 1 is a top plan view of one electrode layer and a common voltage line, which are positioned in one pixel of a display area of a display device according to some embodiments, and FIG. 2 is a top plan view of a plurality of pixels and a plurality of connection electrodes of a display area of a display device according to some embodiments.

Referring to FIG. 1 and FIG. 2, a display device according to some embodiments includes a plurality of pixels PX capable of displaying an image. A plurality of pixels PX, as shown in FIG. 2, may be approximately arranged in a matrix form, but are not limited thereto, and may be repeatedly arranged with a certain rule (e.g., according to a corresponding layout scheme).

Referring to FIG. 1, each pixel PX may include a plurality of sub-pixels PX1, PX2, and PX3. A plurality of sub-pixels PX1, PX2, and PX3 included in each pixel PX may display light of different colors. For example, a plurality of sub-pixels PX1, PX2, and PX3 may display primary colors, such as red, green, and blue. A plurality of sub-pixels PX1, PX2, and PX3 may display various colors by combining various luminances of different primary colors.

Each of the sub-pixels PX1, PX2, and PX3 respectively includes pixel electrodes 191a, 191b, and 191c to which a data signal can be applied, the data signal having luminance information corresponding to light to be displayed, and a plurality of transistors electrically connected thereto. A plurality of pixel electrodes 191a, 191b, and 191c may be positioned on the same layer, and positioned on a pixel electrode layer including the same material.

Each pixel electrode 191a, 191b, and 191c may be respectively electrically connected to the transistor, which is formed in each sub-pixel PX1, PX2, and PX3, through an opening 1184, which is a hole formed in at least one insulating layer positioned below each pixel electrode 191a, 191b, and 191c.

The display device according to some embodiments includes a plurality of common voltage lines 170 and a plurality of connection electrodes 195 for transmitting a common voltage.

The common voltage line 170 may extend lengthwise (e.g., in the y direction). The common voltage line 170 may be arranged one by one at least for each pixel PX (e.g., in the x direction). FIG. 1 and FIG. 2 shows an example in which one common voltage line 170 is positioned for every pixel PX in the x direction (e.g., there may be one common voltage line 170 for multiple pixels PX arranged in the y direction).

For example, there may be at least one connection electrode 195 for each pixel PX in the x direction or the y direction. FIG. 1 and FIG. 2 show an example in which one connection electrode 195 is formed for each pixel PX in each of the x direction and the y direction.

The connection electrode 195 may be positioned in a conductive layer that is different from that of the common voltage line 170.

At least a portion of each connection electrode 195 overlaps a corresponding common voltage line 170 in the z direction that is substantially perpendicular to the x and y directions. The portion of the connection electrode 195 overlapping the common voltage line 170 may be electrically connected to the common voltage line 170 through an opening 1182 of at least one insulating layer positioned between the common voltage line 170 and the connection electrode 195.

Referring to FIG. 2, an emission layer opening 1370 of an emission layer may be positioned on, or may overlap, a portion of a plurality of connection electrodes 195.

The pitch Wa in the x-direction of the emission layer opening 1370, that is, the distance between respective emission layer openings 1370 adjacent in the x-direction, may have a range of about 0.1 mm to about 2.5 mm. Similarly, the pitch Wb in the y direction of the emission layer opening 1370, that is, the distance between respective emission layer openings 1370 adjacent in the y direction, may also have a range of about 0.1 mm to about 2.5 mm. For example, the pitches Wa and Wb of the emission layer openings 1370 in the x direction and the y direction, which may further increase or maximize aspect of the embodiments, may have a range of about 0.8 mm to about 2.5 mm, respectively. The corresponding aspect due thereto will be described in detail later.

The pitches Wa and Wb of the emission layer openings 1370 in the x and the y directions are greater than the pitch of the pixels PX in the x and y directions, respectively.

In some embodiments, the pitch Wa in the x direction of the emission layer openings 1370 may be the same as, or different from, the pitch Wb in the y direction of the emission layer openings 1370.

The connection electrode 195 overlapping the emission layer opening 1370 is electrically connected to the underlying common voltage line 170 through the opening 1182.

The connection electrode 195, which does not overlap with the emission layer opening 1370, as shown in FIG. 2, may be electrically connected to the common voltage line 170 through the opening 1182. However, according to other embodiments, at least some of the connection electrodes 195 that do not overlap with the emission layer opening 1370 also might not overlap with the opening 1182.

According to some embodiments, the x-direction pitch Wa of the emission layer opening 1370 may be greater than the pitch in the x-direction of a plurality of common voltage lines 170, and, for example, may be an integer multiple thereof. In addition, the x-direction pitch Wa of the emission layer opening 1370 may be greater than the pitch of a plurality of connection electrodes 195 in the x-direction, and, for example, may be an integer multiple thereof.

According to other embodiments, the connection electrode 195 of a column, in which only ones of the connection electrodes 195 that do not overlap with the emission layer opening 1370 are arranged, might not overlap with the common voltage line 170. That is, the common voltage line 170 may be formed to not be in a location corresponding to the column including only the connection electrodes 195 in which the emission layer opening 1370 is not formed. Furthermore, the common voltage line 170 may be formed to have the same pitch as the emission layer openings 1370 adjacent in the x direction, that is, the pitch Wa in the x direction of the emission layer openings 1370.

According to other embodiments, at least some of the connection electrodes 195 that are not electrically connected to the common voltage line 170, or the connection electrode(s) 195 that do not overlap with the emission layer opening 1370, may be omitted.

The connection electrode 195 may be positioned in a conductive layer that is different from that of the common voltage line 170, and may be positioned in the same conductive layer as the pixel electrodes 191a, 191b, and 191c, and may also include the same conductive material, although the present disclosure is not limited thereto.

The planar shape of the emission layer opening 1370 may vary, such as circular, elliptical, or polygonal. In embodiments in which the emission layer 1370 is circular will be mainly described. When the emission layer opening 1370 has a circular planar shape, the common electrode 270, which will be described later, may be in more uniform contact with the underlying connection electrode 195 through the emission layer opening 1370.

The detailed structure of the display device according to some embodiments will be described with reference to FIG. 3 to FIG. 5.

Figure 3:
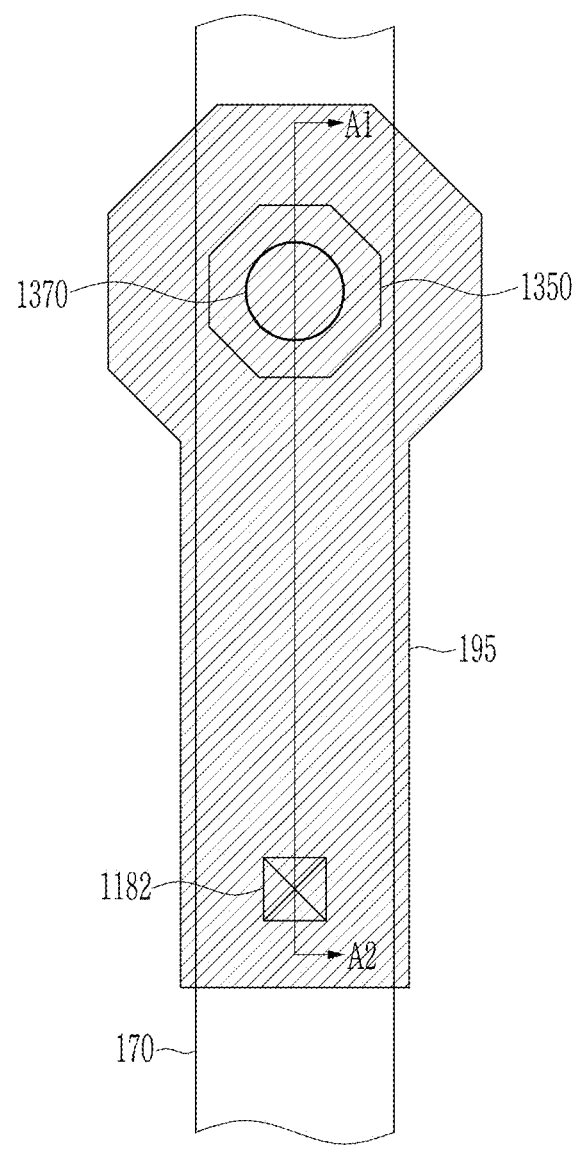
FIG. 3 is a top plan view of a connection electrode of a display device according to some embodiments.
Figure 4:
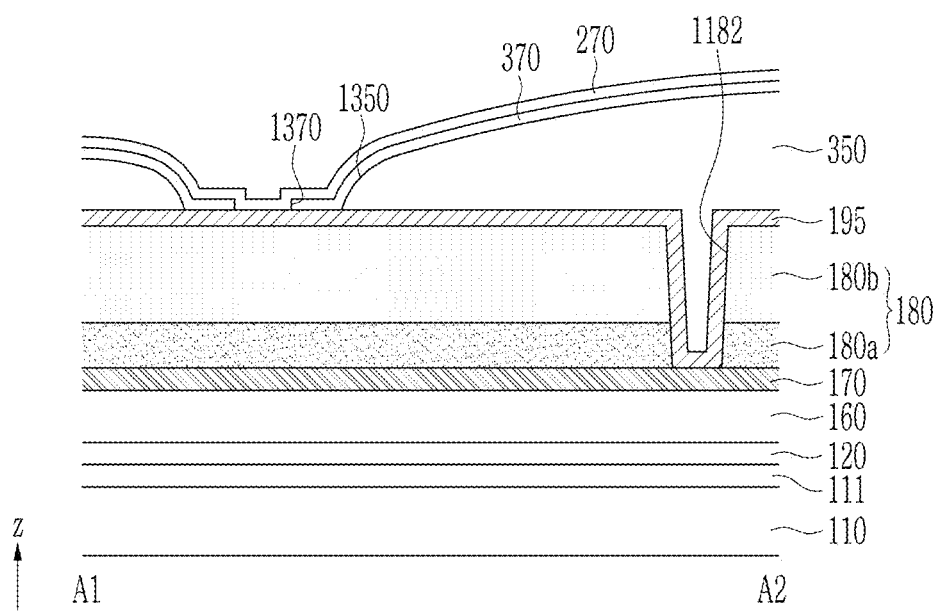
FIG. 4 is a cross-sectional view of a display device shown in FIG. 3 taken along the line A1-A2.
Figure 5:
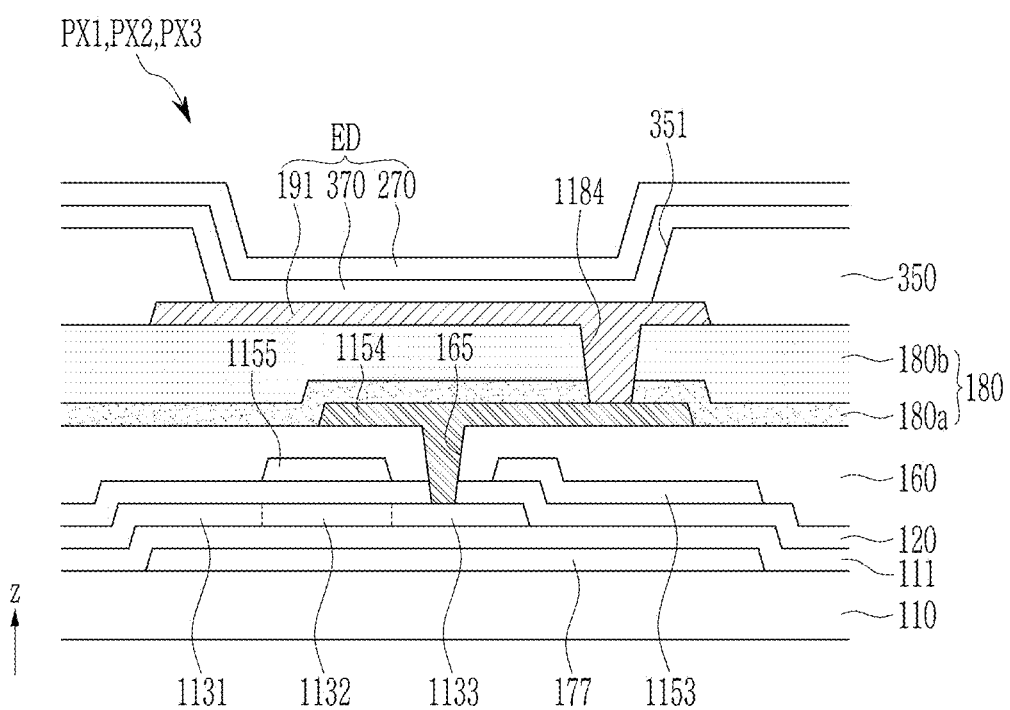
FIG. 5 is a cross-sectional view of one pixel of a display device according to some embodiments.

FIG. 3 is a top plan view of a connection electrode of a display device according to some embodiments, FIG. 4 is a cross-sectional view of a display device shown in FIG. 3 taken along the line A1-A2, and FIG. 5 is a cross-sectional view of one pixel of a display device according to some embodiments.

A display device according to some embodiments may include a substrate 110 including an insulating material, and a buffer layer 111, which is an insulating layer, may be positioned on the substrate 110.

A first conductive layer including a light blocking pattern 177 may be positioned between the substrate 110 and the buffer layer 111.

A semiconductor layer including a channel region 1132, and conductive regions 1131 and 1133 positioned on respective sides of the channel region 1132, may be positioned on the buffer layer 111. Based on one channel region 1132, a conductive region 1131 positioned on one side may be a source region, and a conductive region 1133 positioned on the other side may be a drain region, or vice versa.

A first insulating layer 120 may be positioned on or above the semiconductor layer.

A second conductive layer including a gate electrode 1155 and a lower electrode 1153 may be positioned on the first insulating layer 120. The gate electrode 1155 may overlap the channel region 1132 in the z direction. The gate electrode 1155 may be electrically connected to the lower electrode 1153, and may be formed integrally.

The channel region 1132, the conductive regions 1131 and 1133, and the gate electrode 1155 together may form a single transistor or a section thereof.

A second insulating layer 160 may be positioned on the gate electrode 1155 and the lower electrode 1153.

A third conductive layer including an upper electrode 1154 and a common voltage line 170 may be positioned on the second insulating layer 160.

The upper electrode 1154 may overlap the lower electrode 1153 with the second insulating layer 160 interposed therebetween to form a capacitor. The lower electrode 1153 may also overlap the light blocking pattern 177 with the first insulating layer 120 interposed therebetween.

The upper electrode 1154 may be electrically connected to the conductive region 1133 of the transistor through the opening 165 formed in, or defined by, the second insulating layer 160 and the first insulating layer 120.

A third insulating layer 180 may be positioned on the common voltage line 170 and the upper electrode 1154. The third insulating layer 180 may include a first protective layer 180a and a second protective layer 180b.

The third insulating layer 180 includes or defines a plurality of openings 1184 and a plurality of openings 1182 positioned above, or at a layer that is above, the common voltage line 170.

At least one of the first conductive layer, the second conductive layer, and the third conductive layer may include at least one of metals including copper (Cu), aluminum (Al), magnesium (Mg), silver (Ag), gold (Au), platinum (Pt), palladium (Pd), nickel (Ni), neodymium Nd, iridium (Ir), molybdenum (Mo), tungsten (W), titanium (Ti), chromium (Cr), tantalum (Ta), and alloys thereof, and metal oxides such as indium tin oxide (ITO) and indium zinc oxide (IZO). Each of the first conductive layer, the second conductive layer, and the third conductive layer may be formed of a single layer or multiple layers. For example, at least one of the first conductive layer, the second conductive layer, and the third conductive layer may have a multilayer structure including a lower layer including titanium, an intermediate layer including copper, and an upper layer including ITO.

At least one of the buffer layer 111, the first insulating layer 120, the second insulating layer 160, and the third insulating layer 180 may include an inorganic insulating material such as a silicon nitride (SiNx), a silicon oxide (SiOx), a silicon oxynitride (SiON), etc., and/or an organic insulating material such as polyimide, an acryl-based polymer or, a siloxane-based polymer. The first protective layer 180a of the third insulating layer 180 may be made of an inorganic insulating material, and the second protective layer 180b may be made of an organic insulating material.

A fourth conductive layer including a connection electrode 195 may be positioned on the third insulating layer 180. The connection electrode 195 may be electrically connected to the common voltage line 170 through the opening 1182.

A plurality of pixel electrodes 191 may be positioned on the third insulating layer 180. The pixel electrode 191 may include the pixel electrodes 191*a*, 191*b*, and 191*c* shown in FIG. 1.

According to some embodiments, a plurality of pixel electrodes 191 may be positioned in the same conductive layer as the connection electrode 195, that is, the fourth conductive layer. The pixel electrode 191 may include the same material as the connection electrode 195, and may be formed together in the same process. In this case, the fourth conductive layer may include a transparent metal oxide, such as indium tin oxide (ITO) or indium zinc oxide (IZO).

For example, the fourth conductive layer may be formed of a multilayer such as a triple layer in which a layer including ITO, a layer including silver (Ag), and a layer including ITO are sequentially stacked, or a single layer.

Alternatively, the pixel electrode 191 and the connection electrode 195 may be positioned on different conductive layers, and may include different conductive materials.

The pixel electrode 191 may be electrically connected to the upper electrode 1154 through the opening 1184.

A fourth insulating layer 350 may be positioned on the connection electrode 195 and the pixel electrode 191. The fourth insulating layer 350 may include an organic insulating material such as a polyacryl-based resin or a polyimide-based resin.

The fourth insulating layer 350 has an opening 1350 that overlaps the connection electrode 195 in the z direction, and an opening 351 that overlaps the pixel electrode 191. The opening 1350 may be spaced apart from the opening 1182 of the third insulating layer 180 in plan view (e.g., the xy plan view).

The emission layer 370 may be positioned on the fourth insulating layer 350. The emission layer 370 is positioned entirely over most of the substrate 110, but may have an emission layer opening 1370 overlapping the connection electrode 195.

The emission layer opening 1370 of the emission layer 370 may overlap at least a portion of the opening 1350 of the fourth insulating layer 350. Referring to FIG. 3 and FIG. 4, the emission layer opening 1370 of the emission layer 370 may be positioned within the edge of the opening 1350 of the fourth insulating layer 350 (e.g., in a plan view). In this case, a part of the emission layer 370 may be positioned within the opening 1350 of the fourth insulating layer 350.

Differently from FIG. 3 and FIG. 4, in some embodiments, a portion of the emission layer opening 1370 of the emission layer 370 may overlap a portion of the edge of the opening 1350 of the fourth insulating layer 350.

The emission layer 370 may include an organic light emitting material or an inorganic light emitting material. The emission layer 370 may be positioned within the opening 351 of the fourth insulating layer 350 to be in contact with the pixel electrode 191.

A common electrode 270 is positioned on the emission layer 370. The common electrode 270 may be positioned entirely on (e.g., over) the substrate 110. The common electrode 270 may be electrically connected to the connection electrode 195 through the emission layer opening 1370 of the emission layer 370. The common electrode 270 may be electrically connected to the common voltage line 170 through the connection electrode 195 to receive the common voltage.

The common electrode 270 may include a metal material including silver (Ag) or a transparent metal oxide such as indium tin oxide (ITO) or indium zinc oxide (IZO). The thickness of the common electrode 270 in the z direction may be about 150 angstroms or less, but is not limited thereto. The common electrode 270 may be in contact with the emission layer 370.

The pixel electrode 191, the emission layer 370, and the common electrode 270 of each sub-pixel PX1, PX2, and PX3 together form a light emitting diode (LED) ED. In this case, the pixel electrode 191 may be an anode, and the common electrode 270 may be a cathode.

The display device according to some embodiments will be described with reference to FIG. 6, FIG. 7, and FIG. 8.

Figure 6:
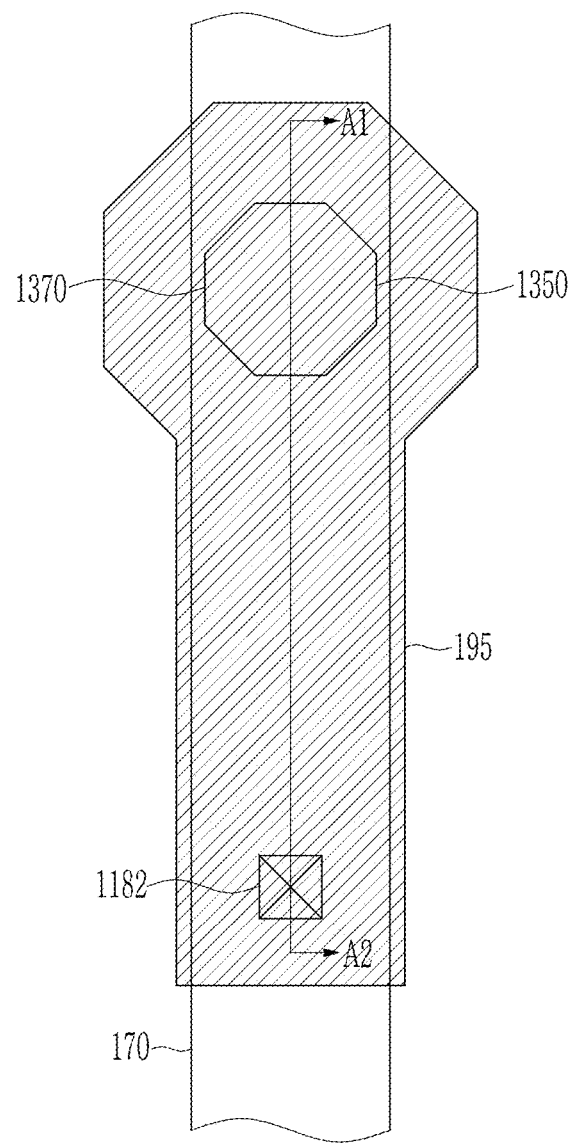
FIG. 6 is a top plan view of a connection electrode of a display device according to some embodiments.
Figure 7:
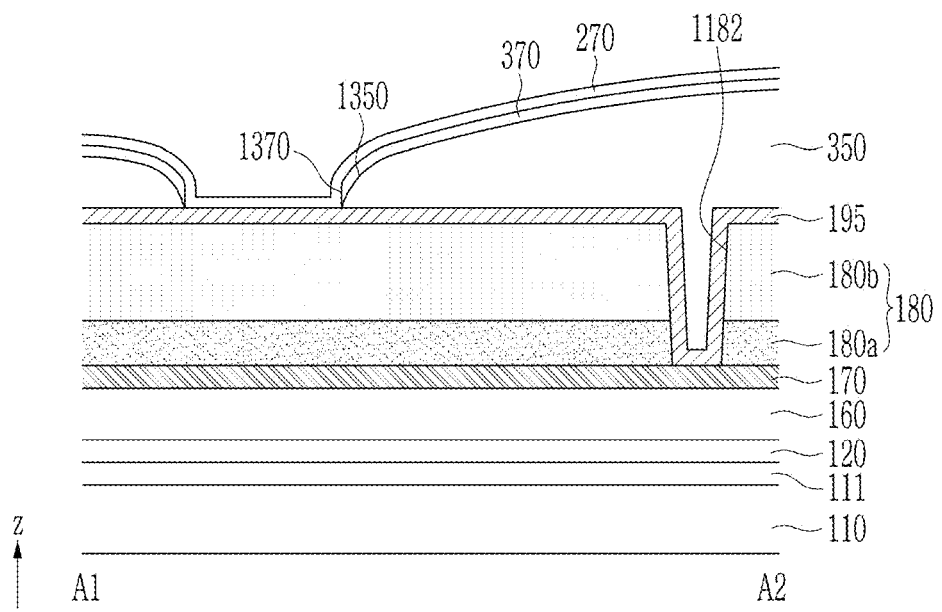
FIG. 7 and FIG. 8 are cross-sectional views of a display device shown in FIG. 6 taken along the line A1-A2.
Figure 8:
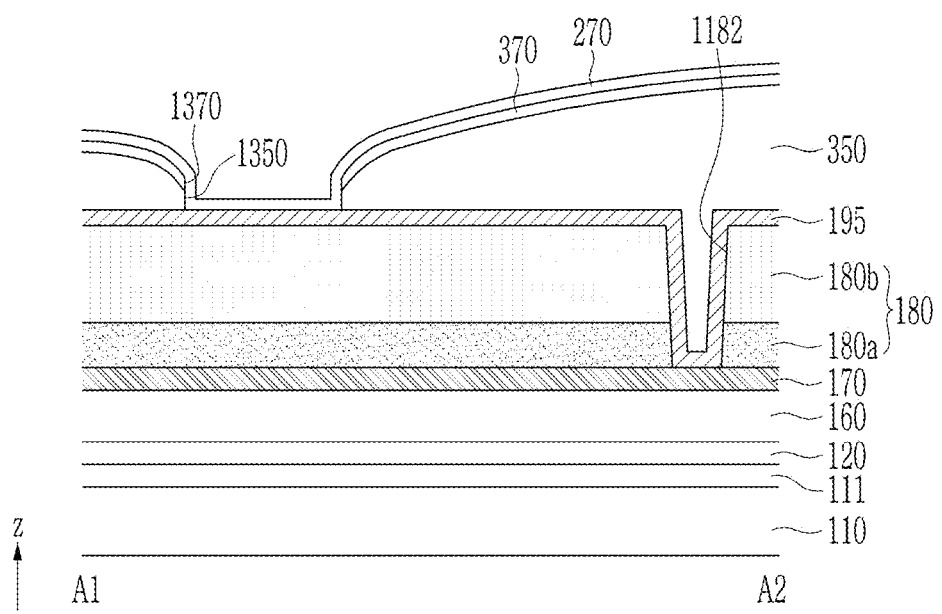

FIG. 6 is a top plan view of a connection electrode of a display device according to some embodiments, and FIG. 7 and FIG. 8 are cross-sectional views of a display device shown in FIG. 6 taken along the line A1-A2.

Referring to FIG. 6 to FIG. 8, the display device according to some embodiments is mostly the same as the display device shown in FIG. 1 to FIG. 5, but the edge of the emission layer opening 1370 of the emission layer 370 may be substantially aligned with the edge of the opening 1350 of the fourth insulating layer 350. Therefore, unlike previous embodiments, the emission layer 370 may not be substantially positioned in the opening 1350 of the fourth insulating layer 350.

The side shape of the opening 1350 of the fourth insulating layer 350, as shown in FIG. 7, may be made obliquely inclined, and as shown in FIG. 8, the side shape of the opening 1350 of the fourth insulating layer 350 may form a substantially flat surface with the side of the emission layer opening 1370.

A manufacturing method of the display device according to some embodiments will be described with reference to FIG. 9 and FIG. 10 along with FIG. 3 to FIG. 8.

Figure 9:
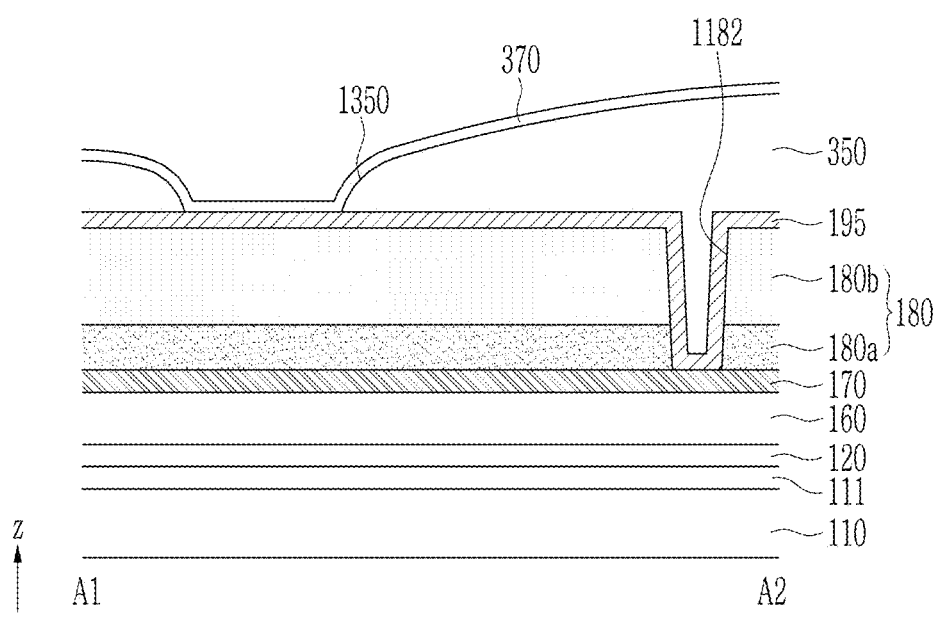
FIG. 9 is a view showing a step of a laser drilling process in a manufacturing method of a display device according to some embodiments.
Figure 10:
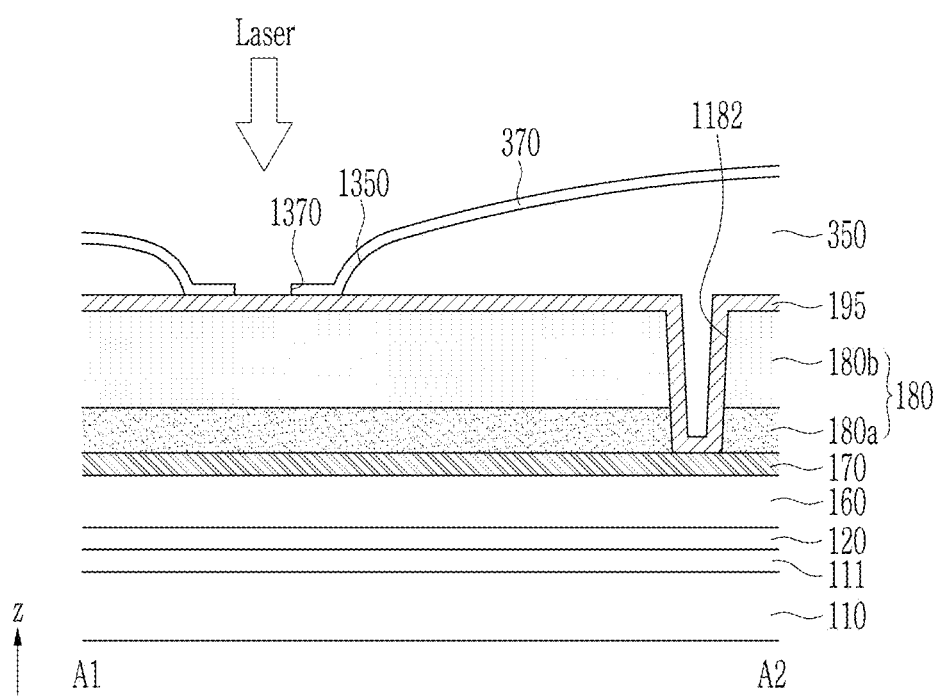
FIG. 10 is a view showing a display device after a laser drilling process in a manufacturing method of a display device according to some embodiments.

FIG. 9 is a view showing a step of a laser drilling process in a manufacturing method of a display device according to some embodiments, and FIG. 10 is a view showing a display device after a laser drilling process in a manufacturing method of a display device according to some embodiments.

Referring to FIG. 9, after forming a plurality of common voltage lines 170 and a plurality of connection electrodes 195 on a substrate 110, a fourth insulating layer 350 is formed and patterned on the connection electrode 195 to form an opening 1350.

Next, an emission layer 370 is stacked on the fourth insulating layer 350.

Next as shown in FIG. 10, an emission layer opening 1370 is formed by removing the emission layer 370 corresponding to the opening 1350 of the fourth insulating layer 350. As a method of forming the emission layer opening 1370, for example, a laser drilling process for forming the emission layer opening 1370 by irradiating laser, may be used. At this time, particles of the emission layer 370 that are removed by the laser may be generated.

In the case of the embodiments corresponding to FIG. 6 to FIG. 8, after stacking the fourth insulating layer 350, the opening 1350 is not directly formed, and the emission layer 370 is stacked on the fourth insulating layer 350. Thereafter, the emission layer 370 and the fourth insulating layer 350 on the connection electrode 195 may be removed together using a process such as laser drilling. Accordingly, the emission layer opening 1370 of the emission layer 370 and the opening 1350 of the fourth insulating layer 350, which are aligned with each other, may be formed.

After forming the emission layer opening 1370, as shown in FIG. 4, FIG. 5, FIG. 7, and FIG. 8 described above, the common electrode 270 is formed on the emission layer 370.

Now, the emission layer opening 1370 of the emission layer 370 of the display device according to some embodiments will be described with reference to FIG. 11 and FIG. 12 along with FIG. 1 to FIG. 8 described above.

Figure 11:
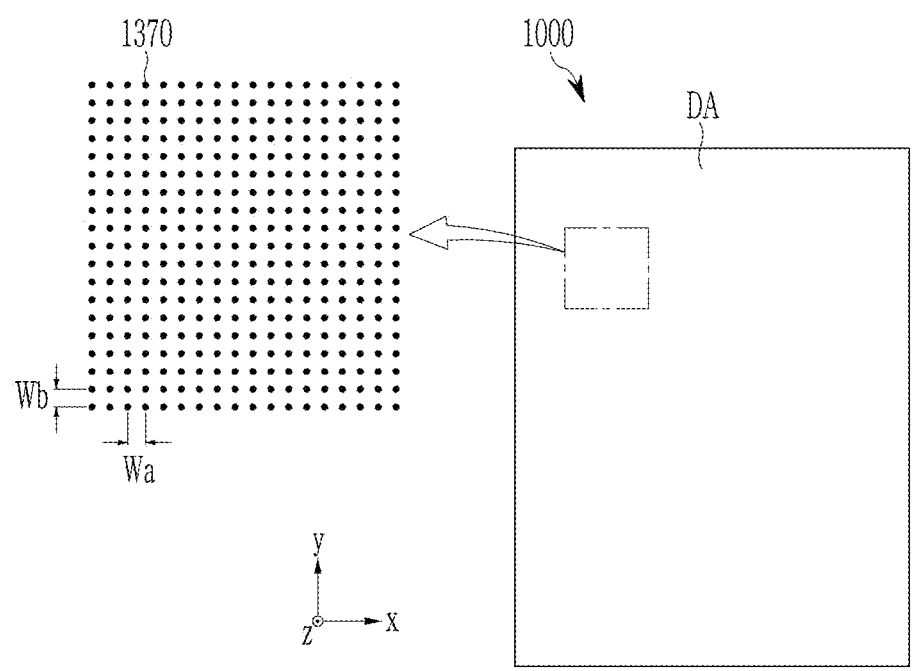
FIG. 11 and FIG. 12 are enlarged top plan views of a display area and a part of the display area in a display device according to some embodiments, respectively.
Figure 12:
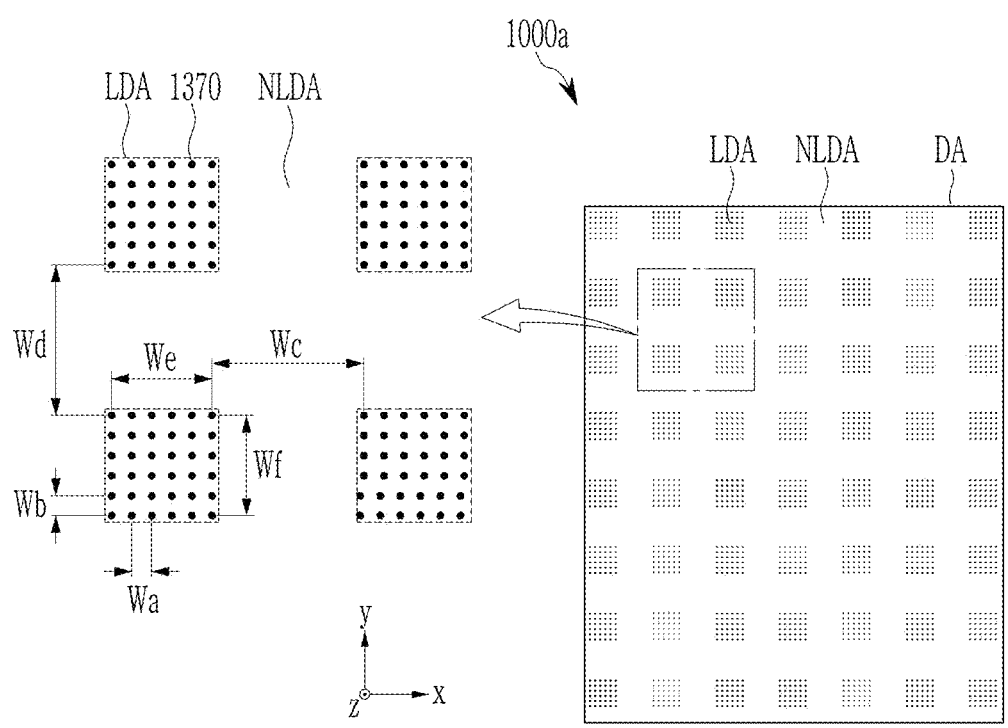

FIG. 11 and FIG. 12 are enlarged top plan views of a display area and a part of the display area in a display device according to some embodiments, respectively, Referring to FIG. 11, the display device 1000 according to some embodiments includes a display area DA capable of displaying an image by including a plurality of pixels. The emission layer positioned in the display area DA has a plurality of emission layer openings 1370 as described above.

A plurality of emission layer openings 1370 may be arranged at a constant interval, that is, at a constant pitch, in each of the x direction and the y direction over the entire display area DA.

In the entire display area DA, the x-direction pitch Wa of the emission layer opening 1370, that is, the distance between the centers of adjacent emission layer openings 1370 that are adjacent in the x-direction, may have a range of about 0.1 mm to about 2.5 mm. Similarly, the y-direction pitch Wb of the emission layer opening 1370, that is, the distance between the centers of adjacent emission layer openings 1370 that are adjacent in the y-direction, may also have a range of about 0.1 mm to about 2.5 mm. For example, pitches Wa and Wb of the emission layer opening 1370 in the x direction and the y direction may have a range of about 0.8 mm to about 2.5 mm, respectively.

The pitch Wa in the x direction of the emission layer opening 1370 may be the same as, or different from, the pitch Wb in the y direction of the emission layer opening 1370. FIG. 11 shows an example in which the x-direction pitch Wa of the emission layer opening 1370 is the same as the pitch Wb in the y-direction of the emission layer opening 1370.

Referring to FIG. 12, the emission layer positioned in the display area DA included in the display device 1000a according to some embodiments may include an opening formation region LDA where a plurality of emission layer openings 1370 are arranged with the constant pitch, and an opening non-formation region NLDA without the emission layer opening 1370.

Unlike FIG. 11, according to some embodiments, respective intervals at which respective pairs of neighboring emission layer openings 1370 are spaced apart, of the emission layer openings 1370 included in the emission layer of the display device 1000a, may include different respective intervals for the x direction and the y direction.

For each of the x and y directions, the opening formation region LDA and the opening non-formation region NLDA are positioned alternately. As shown in FIG. 12, a plurality of opening formation regions LDA may be spaced apart from each other to be arranged in a matrix form, and the opening non-formation region NLDA may be connected in a square mesh shape.

In each opening formation region LDA, a plurality of emission layer openings 1370 may be arranged at a constant interval, that is, at a constant pitch, in each of the x and y directions in the opening formation region LDA.

In the opening formation region LDA, the x direction pitch Wa of the emission layer opening 1370, that is, the distance between the centers of the emission layer openings 1370 adjacent in the x direction, may have the range of about 0.1 mm to about 2.5 mm. Similarly, the y-direction pitch Wb of the emission layer opening 1370, that is, the distance between the centers of the emission layer openings 1370 adjacent in the y-direction, may also have the range of about 0.1 mm to about 2.5 mm. For example, the pitches Wa and Wb of the emission layer openings 1370 in the x direction and the y direction may have the range of about 0.8 mm to about 2.5 mm.

The x-direction width of each opening formation region LDA is substantially the width from the edge of an emission layer opening 1370 positioned on one edge, to the edge of a corresponding emission layer opening 1370 positioned on the opposite edge. However, for convenience of illustration and description, the x direction width We of the opening formation region LDA is defined as the distance from the center of the leftmost emission layer opening 1370 to the center of the rightmost emission layer opening 1370 as shown. Similarly, the y-direction width Wf of each opening formation region LDA is defined as the distance from the center of an uppermost emission layer opening 1370 to the center of a lowermost emission layer opening 1370 as shown.

Similarly, the distance between two adjacent opening formation regions LDA in the x direction, that is, the width in the x direction of the opening non-formation region NLDA positioned between two adjacent opening formation regions LDA, is substantially the width from the right edge of the emission layer opening 1370, which is adjacent to the left of one opening non-formation region NLDA, to the left edge of the emission layer opening 1370 that is adjacent to the right of the corresponding opening non-formation region NLDA. For convenience of illustration and description, as shown, the x-direction width Wc of each opening non-formation region NLDA is defined as the distance from the center of the emission layer opening 1370 adjacent to the left to the center of the emission layer opening 1370 adjacent to the right. Similarly, the y-direction width Wd of each opening non-formation region NLDA is defined as the distance from the center of an emission layer opening 1370 adjacent to the upper side of the non-formation region NLDA to the center of an emission layer opening 1370 adjacent to the lower side, as shown.

The x-direction width We of each opening formation region LDA may be the same as, or different from, the y-direction width Wf thereof. FIG. 12 shows an example in which the x-direction width We of each opening formation region LDA) is equal to the y-direction width Wf.

The x-direction pitch Wa of the emission layer opening 1370 in each opening formation region LDA may be the same as, or different from, the pitch Wb in the y-direction of the emission layer opening 1370. FIG. 12 shows an example where the x-direction pitch Wa of the emission layer opening 1370 is the same as the pitch Wb in the y-direction of the emission layer opening 1370.

FIG. 12 shows an example in which each opening formation region LDA includes a total of the 36 emission layer openings 1370, but is not limited thereto.

The width Wc in the x direction of the opening non-formation region NLDA positioned between two opening formation regions LDA adjacent in the x direction may be larger than the x direction pitch Wa of the emission layer opening 1370 within one opening formation region LDA, and may be equal to, or smaller than, a value that is twice the x-direction pitch Wa of the emission layer opening 1370 plus the x-direction width We of one opening formation region LDA.

Similarly, the y-direction width Wd of the opening non-formation region NLDA positioned between two opening formation regions LDA adjacent in the y-direction may be larger than the y-direction pitch Wb of the emission layer opening 1370 within one opening formation region LDA, and may be equal to or less than the value of which twice of the y-direction pitch (Wb) of the emission layer opening 1370 is added to the y-direction width Wf of one opening formation region LDA.

FIG. 12 shows an example of which the width Wc in the x direction of the opening non-formation region NLDA is approximately equal to the distance obtained by adding twice the x direction pitch Wa of the emission layer opening 1370 to the width We in the x direction of the opening formation region LDA. Also, the y-direction width Wd of the opening non-formation region NLDA is approximately equal to the distance obtained by adding twice the y-direction pitch Wb of the emission layer opening 1370 to the y-direction width Wf of the opening formation region LDA.

The width Wc in the x direction of the opening non-formation region NLDA may be the same as, or different from, the width Wd in the y direction. FIG. 12 shows an example in which the width Wc in the x direction and the width Wd in the y direction of the opening non-formation region NLDA are approximately equal to each other.

An aspect according to the display device according to some embodiments will be described with reference to FIG. 13 to FIG. 17 along with the above-described drawings.

Figure 13:
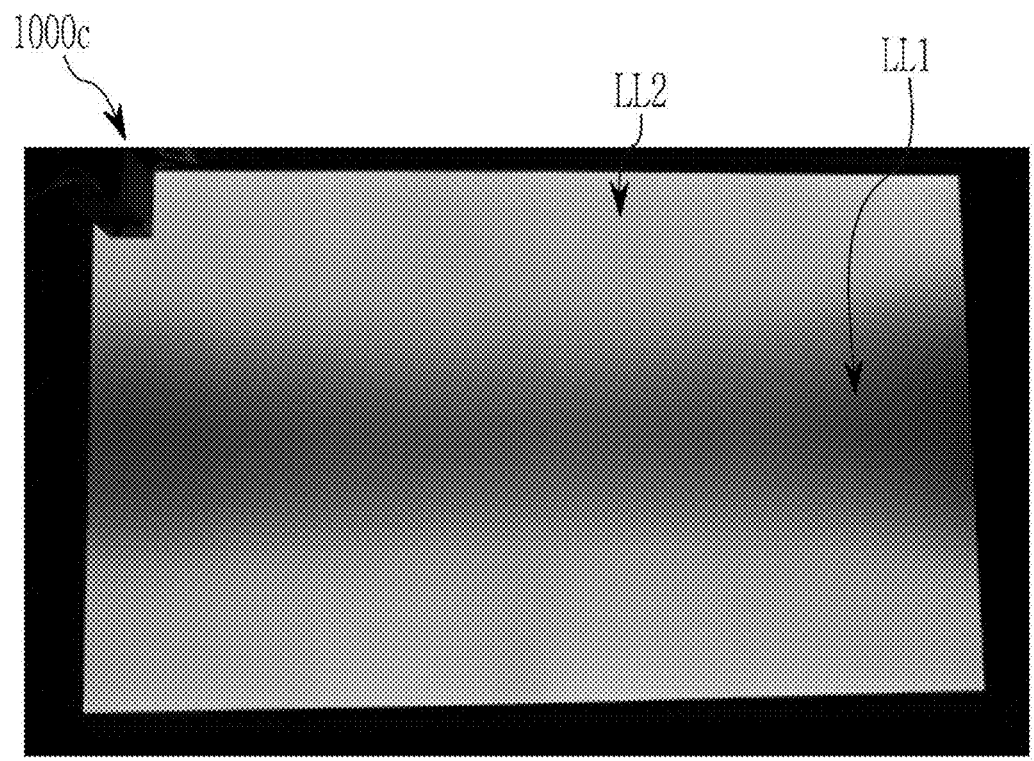
FIG. 13 and FIG. 14 are pictures showing a luminance of a display device according to a comparative example, respectively.
Figure 14:
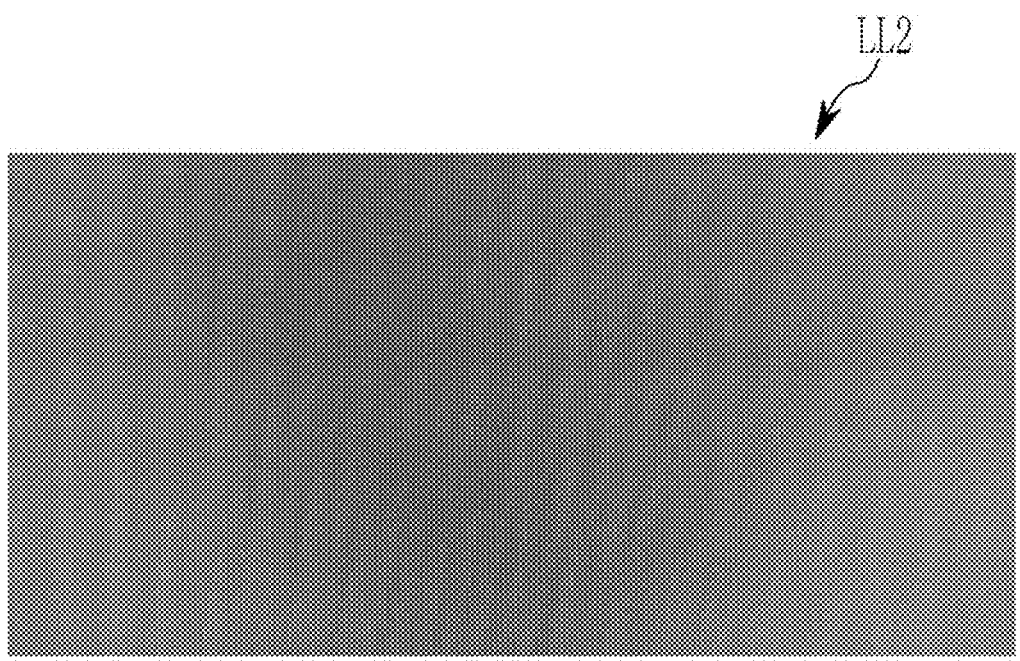
Figure 15:
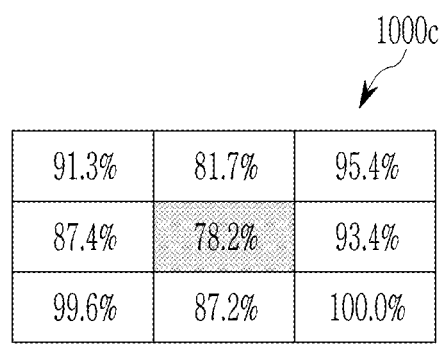
FIG. 15 is a table showing a luminance value of various regions of the display device according to a comparative example as a percentage.
Figure 16:
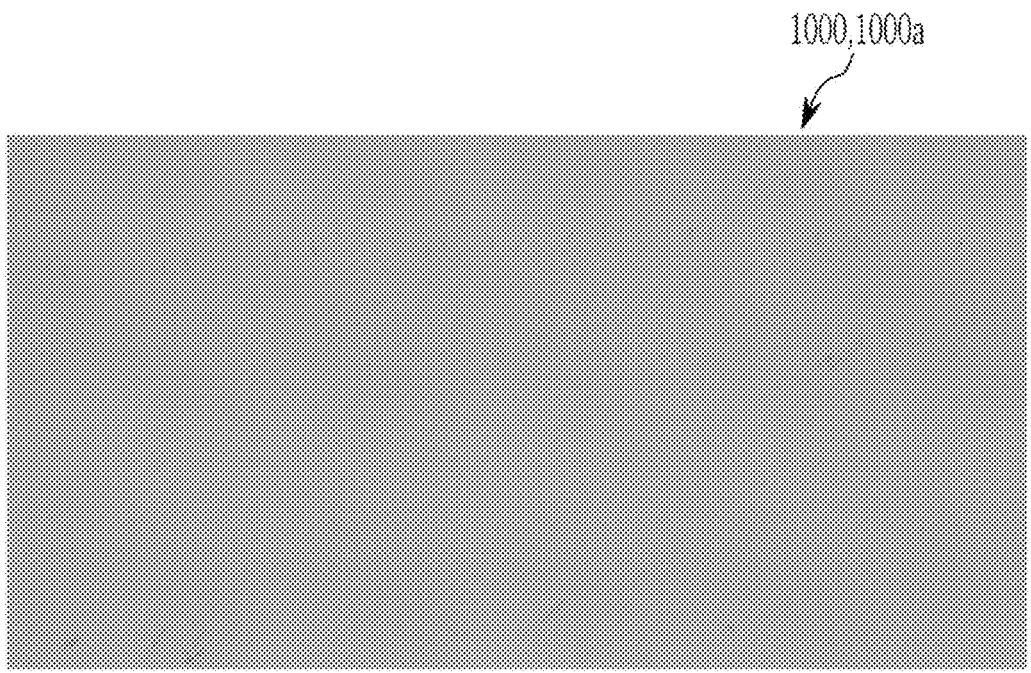
FIG. 16 is a picture showing luminance of a display device according to some embodiments.
Figure 17:
FIG. 17 is a table showing a luminance value of various regions of the display device according to a comparative example as a percentage.

FIG. 13 and FIG. 14 are pictures showing a luminance of a display device according to a comparative example, respectively, FIG. 15 is a table showing a luminance value of various regions of the display device according to a comparative example as a percentage, FIG. 16 is a picture showing a luminance of a display device according to some embodiments, and FIG. 17 is a table showing a luminance value of various regions of the display device according to a comparative example as a percentage.

A display device 1000c according to a comparative example, which is different from embodiments of the present disclosure, includes the same emission layer opening 1370 as some of the previously described embodiments, but the x-direction pitch and the y-direction pitch of the emission layer opening 1370 are larger than 2.5 mm, which is different from the range of the previously described embodiments. When the display device 1000c according to the comparative example is displayed as entirely white, according to the voltage drop of the common voltage transmitted by the common electrode, and as shown in FIG. 13, the overall luminance is lowered, and a dark region LL1 appears as a stain in a wide area.

Referring FIG. 14 in which the region LL2 with relatively high luminance in the display device of FIG. 13 is enlarged, the luminance near the region where the emission layer opening 1370 is formed is high, and the luminance in the region without the emission layer opening 1370 is low, so that a mura, which is a localized spot, may be periodically recognized.

FIG. 15 shows an example of the numerical value of the luminance of the display area of the display device 1000c according to the comparative example shown in FIG. 12. When the maximum luminance is 100%, the overall luminance of the display area is not uniform. Also, when about 80% is used as a standard for a luminance failure, the luminance of the center region of the display device 1000c may be about 78.2%, which is below the standard.

On the other hand, referring to FIG. 16, it may be confirmed that the display device (1000, 1000a) according to some embodiments exhibits uniform and high luminance as a whole when white is displayed like the display device of the comparative example.

FIG. 17 shows an example of the numerical value of the luminance of the display area of the display devices 1000 and 1000a according to some embodiments. When the maximum luminance is 100%, it may be confirmed that the overall luminance of the display area is more than 90% uniform.

Figure 18:
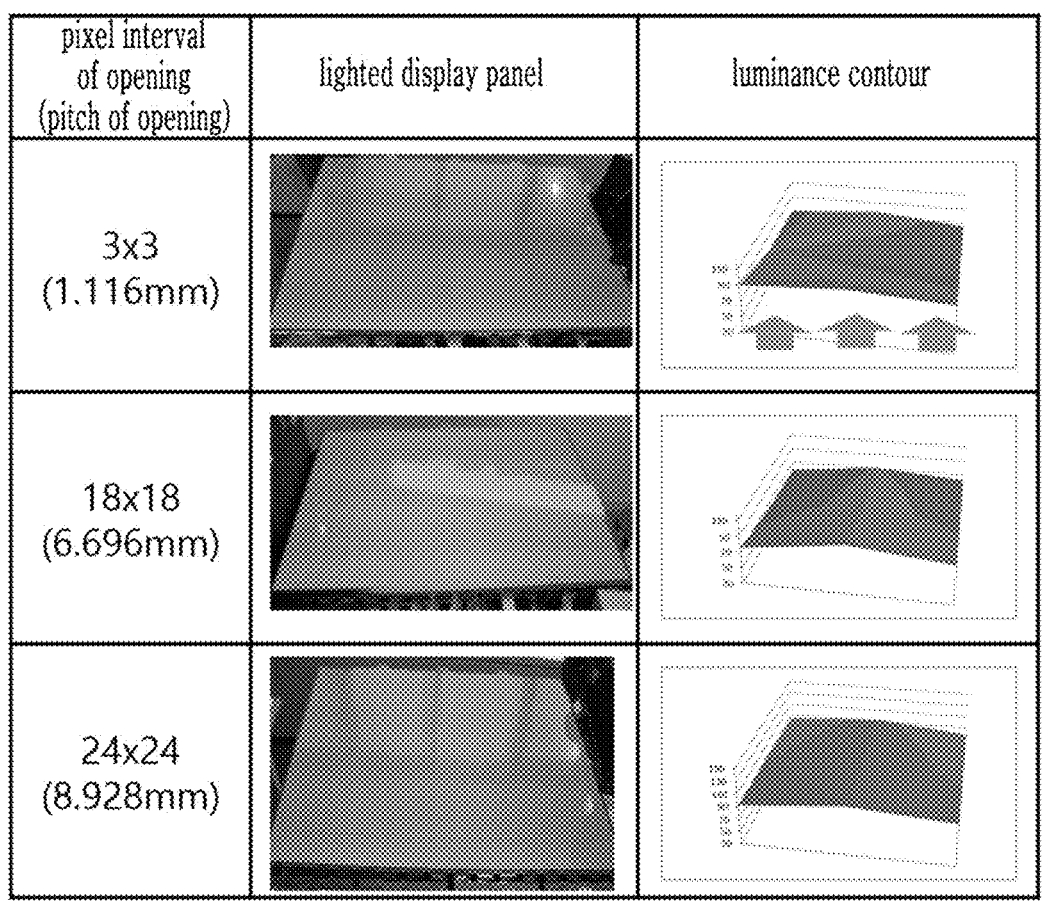
FIG. 18 is a table showing a photograph and a luminance contour diagram showing luminance of several display devices according to some embodiments and a comparative example.

FIG. 18 is a table showing a photograph and a luminance contour diagram showing a luminance of several display devices according to some embodiments and a comparative example.

In the table of FIG. 18, the uppermost display device is a display device according to some embodiments, the pitches Wa and Wb in the x and y directions of the emission layer opening 1370 are about 1.116 mm, and when being expressed based on the interval of the pixels PX, one emission layer opening 1370 is formed for every three pixels PX in the x and y directions. If a formation cycle based on these pixels PX is referred to as a pixel interval of the opening, the emission layer opening 1370 is formed with the pixel interval of 3×3.

In the table of FIG. 18, the middle display device is a display device according to the comparative example, the x-direction and y-direction pitches of the emission layer opening 1370 are about 6.696 mm, and one emission layer opening 1370 is formed for each 18 pixels PX in the x-direction and y-direction when being expressed based on the interval of the pixel PX. That is, the emission layer opening 1370 is formed with the period of the pixel interval of 18×18.

The last display device in Table of FIG. 18 is also a display device according to comparative example, the pitches of the emission layer openings 1370 in the x direction and the y direction are about 8.928 mm, and when the interval of the pixels PX is expressed as a standard, one emission layer opening 1370 is formed for every 24 pixels PX in the x direction and the y direction. That is, the emission layer opening 1370 is formed with the pixel interval of 24×24.

Referring to the image (the center column in the table of FIG. 18) and to the graph showing the luminance of light as a contour line (the right column in the table of FIG. 18), when white is displayed on the three display devices shown in FIG. 18, in the case of the display device according to some embodiments, the overall luminance is high, and in the case of the display device according to the comparative example, the luminance is significantly low.

FIG. 19 is a table showing a common voltage drop and a visibility result of several display devices according to some embodiments, and a comparative example.

Referring to FIG. 19, no matter what the pixel interval of the emission layer opening 1370 is (e.g., any interval such as 3×3, 6×6, 18×18, 24×24, etc.), it may be confirmed that whether the mura is recognized depends on the numerical range of the pitch of the x-direction and y-direction of the emission layer opening 1370.

In the table of FIG. 19, in the above two cases in which the pitch in the x direction and y direction of the emission layer opening 1370 are within the range of about 0.1 mm to about 2.5 mm as in some embodiments, although the pixel interval is different as 3×3 and as 6×6, respectively, there is no mura because the difference in luminance according to the non-uniform of the common voltage in the regions with and without the emission layer opening 1370 is not recognized. However, in the third and fourth cases where the pitches in the x direction and y direction of the emission layer opening 1370 are respectively about 6.696 mm and about 8.928 mm outside the range of the embodiments, regardless of the pixel spacing (18×18, 24×24), the difference in luminance according to the non-uniformity of the common voltage in the regions with and without the emission layer opening 1370 is recognized and is shown as mura.

FIG. 20 is a table showing an example of a pitch of an opening in which mura is not recognized in several display devices according to some embodiments.

Referring to FIG. 20, it may be confirmed that the mura does not appear when the pitch of the x-direction and y-direction of the emission layer opening 1370 is within the numerical range of some embodiments, regardless of the display panel size of the display device. That is, even if the diagonal size of the display panel varies (e.g., 34 inches, 31.5 inches, 65 inches, 55 inches, etc.), and even if the pixel interval of the emission layer opening 1370 varies (e.g., 5×5, 6×6, 3×3, etc.), when the pitches Wa and Wb respectively in the x direction and y direction of the emission layer opening 1370 are both within a suitable range (e.g., about 0.1 mm to about 2.5 mm), as in the described embodiments (e.g., about 1.157 mm, about 1.088 mm, about 1.116 mm, about 0.945 mm, etc.), it may be confirmed that the overall luminance deterioration and mura described above are not recognized.

The aspects of embodiments as described above are shown in all of the display devices 1000 and 1000a according to embodiments described above. That is, according to some embodiments, the mura according to the non-uniform of the common voltage of the common electrode 270 is not recognized, and the uniformity of the luminance of the display area may be improved.

A laser processing apparatus used in a laser drilling process of a manufacturing method of a display device according to some embodiments will be described with reference to FIG. 21.

Figure 21:
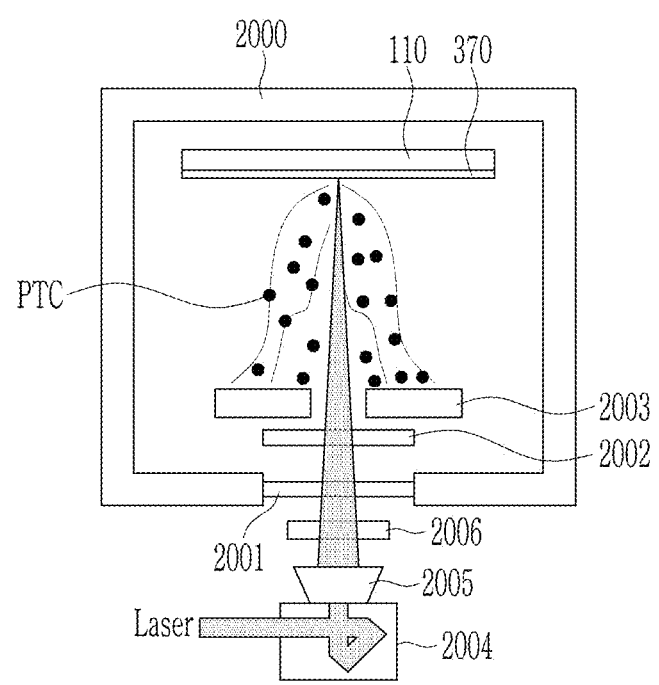
FIG. 21 is a view showing a laser processing apparatus used in a manufacturing method of a display device according to some embodiments.

FIG. 21 is a view showing a laser processing apparatus used in a manufacturing method of a display device according to some embodiments.

Referring to FIG. 21, a laser processing apparatus used in a manufacturing method of a display device according to some embodiments may include a chamber 2000, a protective window 2002, a blocking unit (a baffle) 2003, an optical unit 2004, a scanner 2005, and a diffraction optical element 2006.

In the chamber 2000, the substrate 110, which is an object to be processed by a laser (e.g., by laser drilling), may be positioned. At least one layer is formed on the substrate 110 to form an opening therein by the laser drilling, such as an emission layer 370, for example.

A portion of the chamber 2000 includes a transparent portion 2001. The laser may pass through the transparent portion 2001 into the chamber 2000.

The blocking unit 2003 is positioned between the substrate 110 and the transparent portion 2001. The blocking unit 2003 has a hole through which the laser passing through the transparent portion 2001 may pass, so that the laser may be irradiated toward the substrate 110.

The transparent protective window 2002 may be positioned between the blocking unit 2003 and the transparent portion 2001. The protective window 2002 may be located so as to overlap the aperture of the blocking unit 2003 and the transparent portion 2001.

When the emission layer opening 1370 is formed by irradiating laser to the emission layer 370, particles PTC of the emission layer 370 that are removed are generated or released, and these particles PTC may be primarily blocked from adhering to the transparent portion 2001 by the blocking unit 2003. However, the particles PTC that are not blocked by the blocking unit 2003 may be blocked secondarily by the transparent protective window 2002 overlapping the transparent portion 2001, thereby preventing the transparent portion 2001 from being contaminated by the particles PTC.

The optical unit 2004 may change the direction of the incident laser. The optical unit 2004 may include, for example, at least one mirror. The laser irradiated from the laser source outside the chamber 2000 may be irradiated by changing the direction toward the transparent portion 2001 of the chamber 2000 through the optical unit 2004.

The scanner 2005 may be positioned between the optical unit 2004 and the transparent portion 2001 of the chamber 2000. The scanner 2005 scans the irradiated laser so as to be irradiated on the substrate 110.

The diffraction optical element 2006 may be positioned between the scanner 2005 and the transparent portion 2001. The diffraction optical element 2006 may be irradiated toward the transparent portion 2001 by branching one incident laser beam into a plurality of beams. Accordingly, the emission layer opening 1370 may be formed in a plurality of positions by using one laser beam. For example, in the display device 1000a according to the previously described embodiments corresponding to FIG. 12, a plurality of emission layer openings 1370 positioned in one opening formation region LDA may be simultaneously formed using a plurality of beams branched from one laser beam.

The output per unit area of the laser may be, for example, about 200 mJ/cm$^2$ or less, to reduce or prevent the likelihood of damage to the connection electrode 195, but the present disclosure is not limited thereto. In addition, the laser may use, for example, a UV laser having a wavelength of about 300 nm to about 400 nm, but the present disclosure not limited thereto.

As described above, as the emission layer opening 1370 is formed on the emission layer 370, the generated particles PTC are blocked by the protective window 2002, thereby preventing the transparent portion 2001 of the chamber 2000 from being contaminated. However, because the protective window 2002 may be contaminated by particles PTC, replacement of the protective window 2002 may be suitable depending on the degree of the contamination.

Because the replacement of the protective window 2002 takes time, and therefore a process time increases accordingly, it may be suitable to reduce the contamination to reduce or minimize the replacement of the protective window 2002. According to some embodiments, in the display devices 1000 and 1000a, by making the pitches Wa and Wb in the x-direction or y-direction of the emission layer opening 1370 larger than the pixel pitch and limiting it to about 0.1 mm or more, the number or the time of the replacements of the protective windows 2002 may be optimized. In this case, when the length of a diagonal direction (a direction oblique to the x and y directions) of the display area of the display devices (1000, 1000a) is about 15 inches to about 100 inches, as the minimum value of the pitches Wa and Wb of the emission layer opening 1370 may be limited to about 0.1 mm, it is possible to shorten and optimize the manufacturing process of one display panel.

Figure 22:
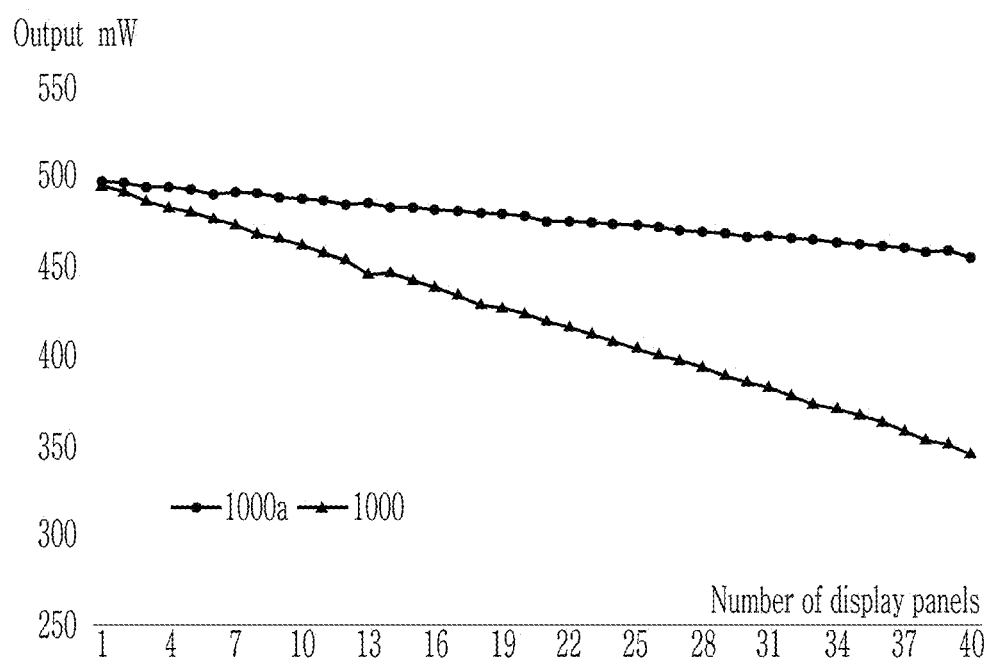
FIG. 22 is a graph showing a change in a laser output according to a contamination of a protection window of a laser processing apparatus used in a manufacturing method of a display device according to some embodiments.

FIG. 22 is a graph showing a change in a laser output according to a contamination of a protection window of a laser processing apparatus used in a manufacturing method of a display device according to some embodiments.

For example, FIG. 22 shows the change of the laser output irradiated to the substrate 110 according to the increase in the number of the display panels of the display devices to be manufactured when the emission layer opening 1370 is formed using the laser processing apparatus shown in FIG.

21 for two display devices 1000 and 1000a according to embodiments described above.

As previously described, for all of the display device 1000a according to some embodiments corresponding to FIG. 12 and of the display device 1000 according to some embodiments corresponding to FIG. 11, the occurrence of the luminance non-uniformity and the mura due to deterioration of the global and local common voltage does not appear, and in the case of the display device 1000a, because the number of the emission layer openings 1370 formed as a whole is smaller than the number of the emission layer openings 1370 of the display device 1000, the amount of the particles PTC generated in the laser drilling process is relatively small in the manufacturing process of the display device 1000a. Therefore, when one protective window 2002 is continuously used to form the emission layer opening 1370 on several display devices, as compared to the display device 1000 shown in FIG. 11, in the case of the display device 1000a shown in FIG. 12, the deterioration of the laser output due to the contamination of the particle PTC is relatively quite slow. Therefore, in the manufacturing process of the display device 1000a shown in FIG. 12, the laser drilling process time may be relatively significantly shortened.

While embodiments of the present disclosure have been described in connection with what is presently considered to be practical embodiments, it is to be understood that the present disclosure is not limited to the disclosed embodiments. On the contrary, it is intended to cover various modifications and equivalent arrangements included within the spirit and scope of the appended claims.

| Description of symbols | |
| --- | --- |
| 110: substrate | 111: buffer layer |
| 120, 160, 180, 350: insulating layer | |
| 165, 351: opening | |
| 170: common voltage line | 177: light blocking pattern |
| 191, 191a, 191b, 191c: pixel electrode | |
| 195: connection electrode | 270: common electrode |
| 370: emission layer | |
| 1000, 1000a, 1000c: display device | |
| 1131, 1133: conductive region | 1132: channel region |
| 1153: lower electrode | 1154: upper electrode |
| 1155: gate electrode | |
| 1182, 1184, 1350, 1370: opening | |
| 2000: chamber | 2001: transparent portion |
| 2002: protective window | 2003: blocking unit |
| 2004: optical unit | 2005: scanner |
| 2006: diffraction optical element | |
| LDA: opening formation region | |
| NLDA: opening non-formation region | |

What is claimed is:

1. A display device comprising:
a substrate;
common voltage lines on the substrate;
connection electrodes on the common voltage lines;
an emission layer on the connection electrode, and defining first openings on at least a portion of the connection electrode, a pitch of the first openings in a first direction having a range of about 0.1 mm to about 2.5 mm; and
a common electrode on the emission layer, and electrically connected to the connection electrode through the first openings.

2. The display device of claim 1, further comprising pixels, the pixels comprising sub-pixels corresponding to different colors and comprising a transistor and a light emitting diode (LED), the light emitting diode (LED) comprising a pixel electrode, the emission layer, and the common electrode.

3. The display device of claim 2, wherein the pitch of the first openings in the first direction is greater than a pitch of the pixels in the first direction.

4. The display device of claim 3, wherein the pitch of the first openings in the first direction is greater than a pitch of the common voltage lines in the first direction.

5. The display device of claim 3, wherein the pitch of the first openings in the first direction is greater than a pitch of the connection electrodes in the first direction.

6. The display device of claim 2, wherein the connection electrodes are at a same conductive layer as, and comprise a same material as, the pixel electrode.

7. The display device of claim 2, further comprising an insulating layer between the pixel electrode and the emission layer, and defining a second opening overlapping one of the first openings.

8. The display device of claim 7, wherein the one of the first openings is within an edge of the second opening in a plan view.

9. The display device of claim 7, wherein an edge of the one of the first openings and an edge of the second opening are aligned with each other.

10. The display device of claim 1, wherein a pitch of the first openings in a second direction, which is substantially perpendicular to the first direction, has a range of about 0.1 mm to about 2.5 mm.

11. A display device comprising:
a substrate;
common voltage lines on the substrate;
connection electrodes on the common voltage lines;
an emission layer contacting the connection electrodes, defining first openings on at least a portion of the connection electrodes, and having an opening formation region defining the first openings and an opening non-formation region not comprising the first openings, the opening formation region and the opening non-formation region being alternately arranged in a first direction; and
a common electrode on the emission layer, and electrically connected to the connection electrodes through the first openings,
wherein a width of the opening non-formation region between the opening formation region and an adjacent opening formation region in the first direction is greater than a pitch of the first openings.

12. The display device of claim 11, wherein the first openings are arranged in the opening formation region with a constant pitch in the first direction, the pitch being in a range of about 0.1 mm to about 2.5 mm.

13. The display device of claim 11, wherein a width of the opening non-formation region between the opening formation region and an adjacent opening formation region in the first direction is equal to or less than a value equal to twice the pitch of the first openings added to a width of the opening formation region in the first direction.

14. The display device of claim 13, wherein the width of the opening formation region in the first direction is equal to a width of the opening formation region in a second direction that is substantially perpendicular to the first direction.

15. The display device of claim 13, wherein the width of the opening non-formation region in the first direction is equal to a width of the opening non-formation region in a second direction that is substantially perpendicular to the first direction.

16. The display device of claim 13, further comprising pixels, the pixels comprising sub-pixels corresponding to different colors, the sub-pixels comprising a transistor and a light emitting diode (LED), the light emitting diode (LED) comprising a pixel electrode, the emission layer, and the common electrode.

17. The display device of claim 16, wherein the pitch of the first openings in the first direction is greater than a pitch of the pixels in the first direction.

18. The display device of claim 11, wherein a pitch of openings in the opening formation region in a second direction that is substantially perpendicular to the first direction has a range from about 0.1 mm to about 2.5 mm.

19. A manufacturing method of a display device, the method comprising:

forming common voltage lines on a substrate;

forming connection electrodes on the common voltage lines;

stacking and patterning an insulating layer on the connection electrodes to form first openings having a pitch in a first direction in a range of about 0.1 mm to about 2.5 mm;

stacking an emission layer on the insulating layer;

forming second openings corresponding to the first openings by removing a portion of the emission layer by a laser drilling process; and forming a common electrode on the emission layer, and electrically connected to the connection electrodes through the second openings.

20. The manufacturing method of the display device of claim 19, wherein the emission layer has an opening formation region defining the first openings, and an opening non-formation region not comprising the first openings, and wherein the opening formation region and the opening non-formation region are alternately arranged in the first direction.

* * * * *